US010280289B2

United States Patent
Gu et al.

(10) Patent No.: US 10,280,289 B2
(45) Date of Patent: May 7, 2019

(54) EPOXY RESIN COMPOSITE AND PRINTED CIRCUIT BOARD COMPRISING INSULATING LAYER USING THE SAME

(71) Applicant: LG INNOTEK CO., LTD., Seoul (KR)

(72) Inventors: Jina Gu, Seoul (KR); Gun Young Gil, Seoul (KR); Jae Man Park, Seoul (KR); Sung Jin Yun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/307,639

(22) PCT Filed: Apr. 16, 2015

(86) PCT No.: PCT/KR2015/003831
§ 371 (c)(1),
(2) Date: Oct. 28, 2016

(87) PCT Pub. No.: WO2015/167149
PCT Pub. Date: Nov. 5, 2015

(65) Prior Publication Data
US 2017/0051133 A1    Feb. 23, 2017

(30) Foreign Application Priority Data
Apr. 30, 2014    (KR) .................. 10-2014-0052527

(51) Int. Cl.
*H05K 1/02* (2006.01)
*C08K 9/02* (2006.01)
(Continued)

(52) U.S. Cl.
CPC .................. *C08K 9/02* (2013.01); *C08K 3/22* (2013.01); *C08K 3/38* (2013.01); *C08L 63/00* (2013.01);
(Continued)

(58) Field of Classification Search
CPC .... C08K 9/02; C08K 3/22; C08K 3/38; C08L 63/00; H01B 3/40
(Continued)

(56) References Cited

U.S. PATENT DOCUMENTS

| 5,330,937 A | 7/1994 | Ellison-Hayashi et al. |
| 6,913,827 B2 | 7/2005 | George et al. |
| 2013/0342966 A1* | 12/2013 | Horio ..................... H01G 9/028 361/524 |

FOREIGN PATENT DOCUMENTS

| EP | 2 684 904 | 1/2014 |
| KR | 10-2010-134313 | 12/2010 |

(Continued)

OTHER PUBLICATIONS

International Search Report (with English translation) and Written Opinion dated Jul. 28, 2015 issued in Application No. PCT/KR2015/003831.
(Continued)

*Primary Examiner* — Tremesha S Willis
(74) *Attorney, Agent, or Firm* — Ked & Associates, LLP

(57) ABSTRACT

An epoxy resin composition according to one embodiment of the present invention comprises an epoxy resin, a curing agent, and an inorganic filler, and the inorganic filler includes boron nitride on which a metal oxide film is formed.

12 Claims, 1 Drawing Sheet

(51) Int. Cl.
  *C08K 3/22*   (2006.01)
  *C08K 3/38*   (2006.01)
  *C08L 63/00*  (2006.01)
  *H01B 3/40*   (2006.01)
  *H05K 1/03*   (2006.01)

(52) U.S. Cl.
  CPC ............ *H01B 3/40* (2013.01); *H05K 1/0204* (2013.01); *H05K 1/0298* (2013.01); *H05K 1/0373* (2013.01); *H05K 2201/0209* (2013.01); *H05K 2201/0227* (2013.01)

(58) Field of Classification Search
  USPC ........................................................ 174/258
  See application file for complete search history.

(56) References Cited

FOREIGN PATENT DOCUMENTS

| KR | 10-2014-0009145 | 1/2014 |
| KR | 10-1360551 | 2/2014 |
| WO | WO 2010/141432 | 12/2010 |
| WO | WO 2012/053524 | 4/2012 |

OTHER PUBLICATIONS

European Search Report dated Oct. 23, 2017 issued in Application No. 15785251.8.

\* cited by examiner

EPOXY RESIN COMPOSITE AND PRINTED CIRCUIT BOARD COMPRISING INSULATING LAYER USING THE SAME

CROSS-REFERENCE TO RELATED PATENT APPLICATIONS

This application is a U.S. National Stage Application under 35 U.S.C. § 371 of PCT Application No. PCT/KR2015/003831, filed Apr. 16, 2015, which claims priority to Korean Patent Application No. 10-2014-0052527, filed Apr. 30, 2014, whose entire disclosures are hereby incorporated by reference.

TECHNICAL FIELD

The present invention relates to an epoxy resin composition, and more particularly, to an epoxy resin composition, and a printed circuit board comprising an insulating layer using the same.

BACKGROUND ART

A printed circuit board may include a circuit pattern formed on an insulating layer, and various electronic parts may be mounted on the printed circuit board.

The electronic part mounted on the printed circuit board may be, for example, a heating element. Heat emitted from the heating element may degrade performance of the printed circuit board.

Due to trends toward higher integration and higher capacity of the electronic parts, there is growing concern for heat dissipation of the printed circuit board. To solve the heat dissipation problem of the printed circuit board, an insulating layer having high thermal conductivity and a low dielectric constant is needed. Generally, for the insulating layer of the printed circuit board, a resin composition comprising a resin, a curing agent and an inorganic filler may be used.

Here, the inorganic filler may comprise boron nitride. Due to excellent thermal conductivity and heat dissipation and high electrical resistance, boron nitride may have excellent electric insulation. However, since boron nitride also has an excellent lubrication property due to a low friction coefficient, it has a lower affinity to another material.

DISCLOSURE

Technical Problem

The present invention is directed to providing an epoxy resin composition and a printed circuit board comprising an insulating layer using the same.

Technical Solution

An inorganic filler according to one embodiment of the present invention comprises boron nitride, and a metal oxide film which is formed on a surface of the boron nitride.

The epoxy resin composition according to one embodiment of the present invention comprises an epoxy resin, a curing agent, and an inorganic filler, wherein the inorganic filler comprises boron nitride on which a metal oxide film is formed.

A printed circuit board according to one embodiment of the present invention comprises a metal plate, an insulating layer formed on the metal plate, and a circuit pattern formed on the insulating layer, wherein the insulating layer comprises an epoxy resin, a curing agent and an inorganic filler, and the inorganic filler includes an epoxy resin composition including boron nitride on which a metal oxide film is formed.

A printed circuit board according to another embodiment of the present invention comprises multiple circuit pattern layers sequentially disposed, and multiple insulating layers disposed between the multiple circuit pattern layers, wherein at least one of the multiple insulating layers comprises an epoxy resin, a curing agent, and an inorganic filler, and the inorganic filler comprises an epoxy resin composition including boron nitride on which a metal oxide film is formed.

Advantageous Effects

According to an embodiment of the present invention, an epoxy resin composition having high thermal conductivity, excellent adhesion strength, and processability may be obtained. Using the epoxy resin composition, an insulating material having an excellent heat dissipation effect and high peel strength may be obtained, and the heat dissipation and reliability of the printed circuit board may be increased.

MODES OF THE INVENTION

Figure 1:
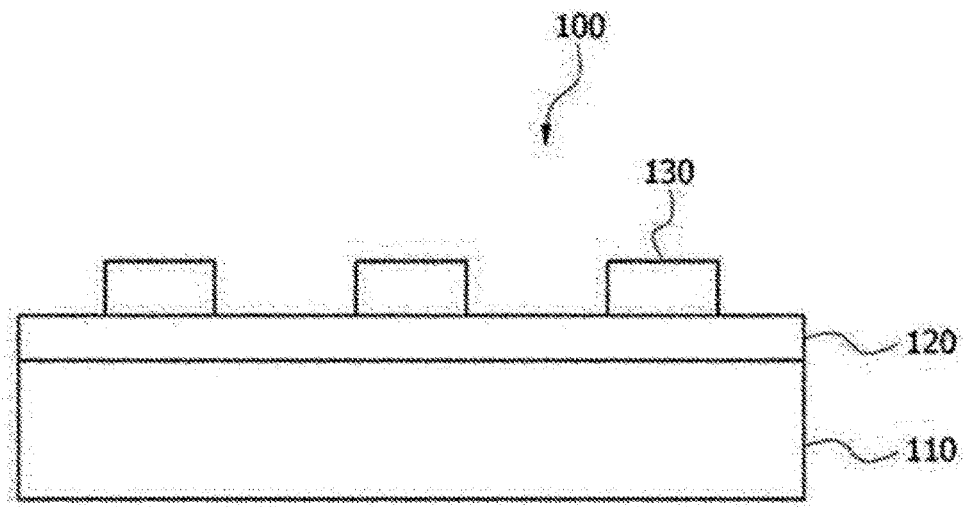
FIG. 1 is a cross-sectional view of a printed circuit board according to one embodiment of the present invention.

Since the present invention may have various modifications and various exemplary embodiments, specific exemplary embodiments will be illustrated in the drawings and described. However, there is no intention to limit the present invention to the specific exemplary embodiments, and it should be understood that the present invention covers all the modifications, equivalents and alternatives included in the spirit and technical scope of the present invention.

Terms including an ordinal number such as "first" or "second" may be used to describe various components, but the components are not limited by the above terms. The above terms are used only to discriminate one component from another component. For example, without departing from the scope of the present invention, a second component may be referred to as a first component, and similarly, the first component may be referred to as the second component. The term "and/or" includes a combination of a plurality of associated disclosed items or any item of the plurality of associated disclosed items.

Terms used in the present application are used only to describe specific exemplary embodiments and are not intended to limit the present invention. Singular expressions used herein include plurals expressions unless they have definitely opposite meanings in the context. In the present application, it should be understood that the term "comprise," "include" or "have" indicates that a feature, a number, a step, an operation, a component, a part or the combination thereof described in the specification is present, but does not in advance exclude a possibility of the presence or addition of one or more other features, numbers, steps, operations, components, parts, or combinations thereof.

Unless defined otherwise, all terms used herein including technological or scientific terms have the same meaning as those generally understood by a person ordinary skill in the art to which the present invention pertains. It should be understood that terms defined in a generally used dictionary have the same meaning as the contextual meaning of associated techniques, and if not apparently defined in this application, the terms shall not be construed to have idealistic or excessively formal meanings.

When a component of a layer, film, region or plate is placed "on" a different component, the component may be placed "directly on" the other component, or a third component may intervene between the two components. In contrast, when a component is placed "directly on" a different component, there are no intervening components between the two components.

Hereinafter, with reference to the accompanying drawings, exemplary embodiments will be described in detail, and regardless of the reference marks on the drawings, like reference numerals will be assigned to similar or corresponding components, and duplicated descriptions thereof will be omitted.

In the specification, wt % may be replaced by parts by weight.

An epoxy resin composition according to an embodiment of the present invention comprises an epoxy resin, a curing agent, and an inorganic filler.

More specifically, the epoxy resin composition according to the embodiment of the present invention comprises 3 to 60 wt % of an epoxy resin including a crystalline epoxy compound, 0.1 to 5 wt % of a curing agent, and 35 to 96.9 wt % of an inorganic filler including boron nitride on which a metal oxide film is formed.

When the epoxy resin composition includes 3 to 60 wt % of the epoxy resin, the composition has high strength and thus has an excellent cohesion property, thereby easily controlling a ed thickness. In addition, when the epoxy resin composition comprises 0.1 to 5 wt % of the curing agent, the composition is easily cured and has high strength and an excellent cohesion property. In addition, when the epoxy resin composition comprises 35 to 96.9 wt % of the inorganic filler including boron nitride on which a metal oxide film is formed, the composition has high adhesive strength and excellent thermal conductivity, low electric conductivity, and excellent low temperature expansion, high heat resistance and excellent moldability.

Here, the crystalline epoxy compound may include a mesogen structure. The mesogen is the basic unit of a liquid crystal and includes a rigid structure. The mesogen may include, for example, rigid structures (a) to (e), which are shown below.

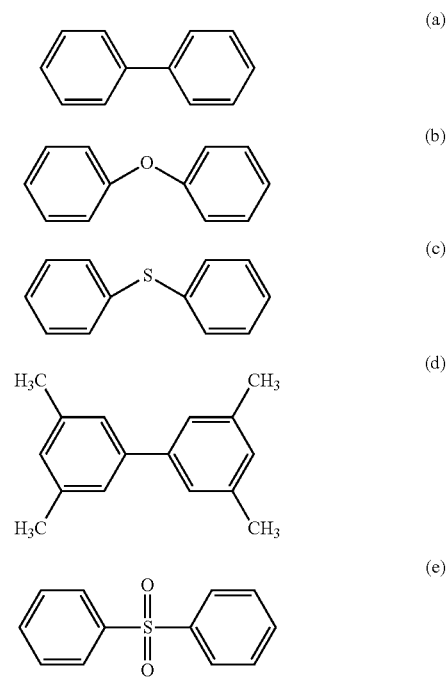

In an embodiment of the present invention, the crystalline epoxy compound including the mesogen structure may include, for example, 4,4'-biphenolether diglycidyl ether, that is, SE-4280, but the present invention is not limited thereto.

In an embodiment of the present invention, the crystalline epoxy compound may include, for example, at least one of Formulas 1 to 12.

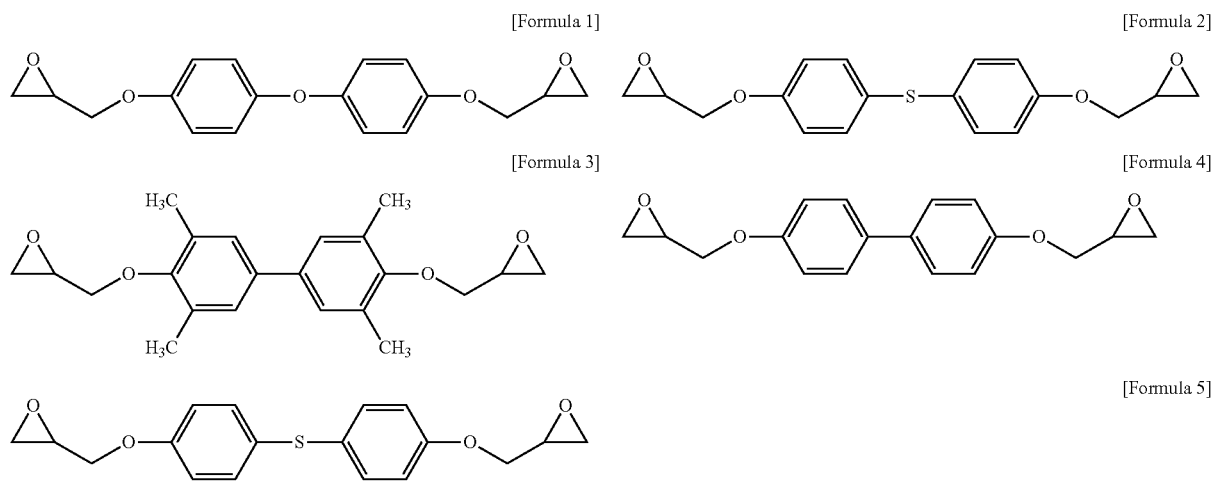

-continued

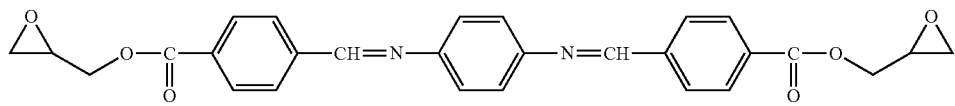
[Formula 6]

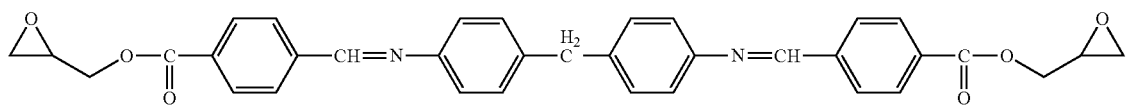
[Formula 7]

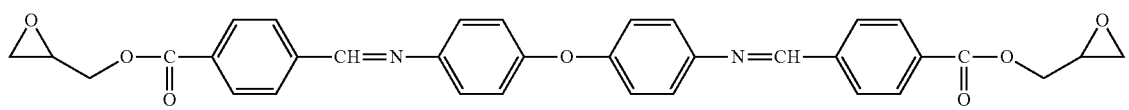
[Formula 8]

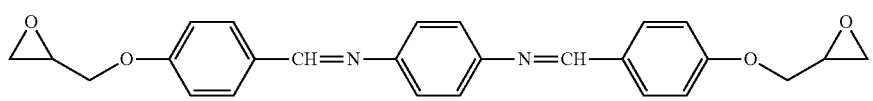
[Formula 9]

[Formula 10]

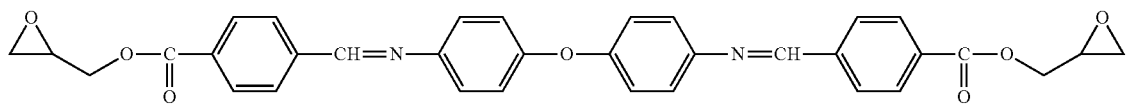
[Formula 11]

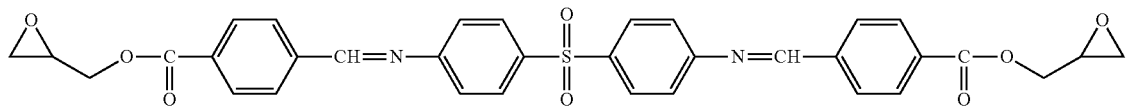
[Formula 12]

In addition, the epoxy resin composition according to one embodiment of the present invention may further comprise an amorphous epoxy compound. The epoxy resin composition may comprise 1 to 40 parts by weight of the amorphous epoxy compound with respect to 10 parts by weight of the crystalline epoxy compound. When the epoxy resin composition comprises the crystalline epoxy compound and the amorphous epoxy compound at the above-mentioned ratios, room temperature stability may be increased.

The amorphous epoxy compound may be a conventional amorphous epoxy compound having two or more epoxy resins in the molecule.

The amorphous epoxy compound may be, for example, a glycidylether compound derived from one of bisphenol A, bisphenol F, 3,3',5,5'-tetramethyl-4,4'-dihydroxydiphenylmethane, 4,4'-dihydroxydiphenylsulfone, 4,4'-dihydroxydiphenyl sulfide, 4,4'-dihydroxydiphenylketone, fluorene bisphenol, 4,4'-biphenol, 3,3',5,5'-tetramethyl-4,4'-dihydroxybiphenyl, 2,2'-biphenol, resorcin, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, dihydric phenols including allylated bisphenol A, allylated bisphenol F, and allylated phenolnovolac, or trihydric or more phenols including phenol novolac, bisphenol A novolac, o-cresolnovolac, m-cresolnovolac, p-cresolnovolac, xylenolnovolac, poly-p-hydroxy styrene, tris-(4-hydroxyphenyl)methane, 1,1,2,2-tetrakis(4-hydroxyphenyl)ethane, fluoroglycinol, pyrogallol, t-butylpyrogallol, allylated pyrogallol, polyallylated pyrogallol, 1,2,4-benzenetriol, 2,3,4-trihydroxybenzophenone, a phenolaralkyl resin, a naphtolaralkyl resin, or a dicyclopentadiene-based resin, halogenated bisphenols such as tetrabromobisphenol A, and mixtures thereof.

An example of the amorphous epoxy compound is represented by Formula 13.

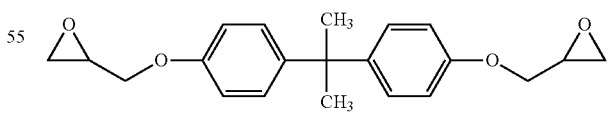
[Formula 13]

In addition, the curing agent included in the epoxy resin composition according to one embodiment of the present invention may include at least one selected from an amine-based curing agent, a phenol-based curing agent, an acid anhydride-based curing agent, a polymercaptane-based curing agent, a polyaminoamide-based curing agent, an isocyanate-based curing agent, and a block isocyanate-based curing agent.

The amine-based curing agent may be, for example, 4,4'-diamino diphenyl sulfone. Formula 14 below is an example of diaminodiphenylsulfones.

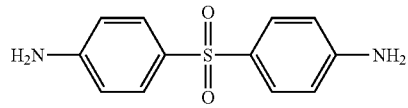

[Formula 14]

Other examples of the amine-based curing agents may be aliphatic amines, polyetherpolyamines, alicyclic amines, or aromatic amines, wherein the aliphatic amines may include ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine, and tetra(hydroxyethyl)ethylenediamine. The polyetherpolyamine may be one of triethyleneglycoldiamine, tetraethyleneglycoldiamine, diethyleneglycolbis(propylamine), polyoxypropylenediamine, polyoxypropylenetriamine, and a mixture thereof. The alicyclic amines may include isophorone diamine, methacene diamine, N-aminoethylpiperazine, bis(4-amino-3-methyldicyclohexyl)methane, bis(aminomethyl)cyclohexane, 3,9-bis(3-aminopropyl)2,4,8,10-tetraoxaspiro(5,5)undecane, and norbornene diamine. The aromatic amine may be one selected from tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenyl ethane, 2,4-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyl dimethyl diphenyl methane, α,α'-bis(4-aminophenyl)-p-diisopropylbenzene, and a mixture thereof.

The phenol-based curing agent may be, for example, one selected from bisphenol A, bisphenol F, 4,4'-dihydroxydiphenylmethane, 4,4'-dihydroxydiphenylether, 1,4-bis(4-hydroxyphenoxy)benzene, 1,3-bis(4-hydroxyphenoxy)benzene, 4,4'-dihydroxydiphenylsulfide, 4,4'-dihydroxydiphenylketone, 4,4'-dihydroxydiphenylsulfone, 4,4'-dihydroxydiphenylester, 4,4'-dihydroxybiphenyl, 2,2'-dihydroxybiphenyl, 10-(2,5-dihydroxyphenyl)-10H-9-oxa-10-phosphaphenanethrene-10-oxide, phenolnovolac, bisphenol A novolac, o-cresolnovolac, m-cresolnovolac, p-cresolnovolac, xylenolnovolac, poly-p-hydroxystyrene, hydroquinone, resorcine, catechol, t-butylcatechol, t-butylhydroquinone, fluoroglycinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated product or polyallylated product of the dihydroxynaphthalene, allylated bisphenol A, allylated bisphenol F, allylated phenolnovolac, allylated pyrogallol, and a mixture thereof.

The acid anhydride-based curing agent may be, for example, one of dodecenylsuccinic anhydride, polyadipic anhydride, polyazelaic anhydride, polysebacic anhydride, poly(ethyloctadecanedioic acid)anhydride, poly(phenylhexadecanhexadecanedioic acid)anhydride, methyltetrahydrophthalic anhydride, methylhexahydrophthalic anhydride, hexahydrophthalic anhydride, methylhymic anhydride, tetrahydrophthalic anhydride, trialkyltetrahydrophthalic anhydride, methylcyclohexenedicarbonyl anhydride, methylcyclohexenetetracarbonyl anhydride, phthalic anhydride, trimellitic anhydride, pyromellitic anhydride, benzophenonetetracarbonyl anhydride, ethyleneglycol bistribismellitate, HET anhydride, nadic anhydride, methyl nadic anhydride, 5-(2,5-dioxotetrahydro-3-furanyl)-3-methyl-3-cyclohexane-1,2-dicarbonyl anhydride, 3,4-di carb oxy-1,2,3,4-tetrahydro-1-naphthalene succinic dianhydride, 1-methyl-dicarboxy-1,2,3,4-tetrahydro-1-naphthalene succinic dianhydride, and a mixture thereof.

A mixture of two or more curing agents may be used.

The epoxy resin composition according to one embodiment of the present invention may further include a curing accelerator. The curing accelerator may be, for example, a curing accelerator for an amine, imidazole, organic phosphine or Lewis acid, and specifically, a tertiary amine such as 1,8-diazabicyclo(5,4,0)undecene-7, tirethylenediamine, benzyldimethylamine, triethanol amine, dimethylaminoethanol or tris(dimethylaminomethyl)phenol, an imidazole such as 2-methylimidazole, 2-phenylimidazole, 2-phenyl-4-methylimidazole or 2-heptadecylimidazole, an organic phosphine such as tributylphosphine, methyldiphenylphosphine, triphenylphosphine, diphenylphosphine or phenylphosphine, a tetrasubstituted phosphonium.tetrasubstituted borate such as tetraphenyphosphonium.tetraphenylborate, tetraphenyphosphonium.ethyltriphenylborate or tetrabutylphosphonium.tetrabutylborate, or a tetraphenylborate such as 2-ethyl-4-methyl imidazole.tetraphenylborate or N-methylmorpholine.tetraphenylborate.

Formula 15 represents an example of imidazole-based curing accelerators.

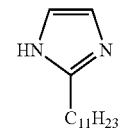

[Formula 15]

When the epoxy resin composition according to one embodiment of the present invention comprises the curing accelerator of Formula 15, cohesion with a metal may be increased. Therefore, since adhesive strength between an insulating layer and a circuit pattern formed of copper is increased and probability of separation of the circuit pattern and short circuit probability are reduced, it is easy to process the printed circuit board, and reliability of the printed circuit board is increased.

In addition, the epoxy resin composition according to one embodiment of the present invention comprises an inorganic filler including 35 to 96.9 wt % of boron nitride on which a metal oxide film is formed. Since common boron nitride has excellent thermal conductivity but has low wettability with respect to an epoxy resin, it has low adhesive strength with respect to the printed circuit board and low processability. However, when the metal oxide film is formed on the boron nitride surface, wettability with respect to the epoxy resin may be increased, and dispersability, adhesive strength, and molding processability may be improved. Here, the metal oxide film may include at least one of titanium oxide ($TiO_2$), aluminum oxide ($Al_2O_3$), and zirconium oxide ($ZrO_2$). Here, the boron nitride may be plate-shaped boron nitride or a boron nitride agglomerate formed of plate-shaped boron nitride.

According to one embodiment of the present invention, the boron nitride having the metal oxide film may be included at 45 to 65 wt %, and preferably 50 to 60 wt % with respect to the total epoxy resin composition. When the boron nitride having the metal oxide film is included within such a range, the epoxy resin composition having both of excellent thermal conductivity and adhesive strength may be obtained.

However, the boron nitride has a very stable surface and thus has low reactivity. Therefore, in one embodiment of the present invention, an atomic layer deposition (ALD) process is used to deposit metal oxide on the boron nitride surface. For example, the metal oxide film may be formed by adsorbing an Al metal precursor material onto the boron nitride surface (①), reacting the precursor material with the uppermost material through oxygen-species plasma (②), and chemically removing unadsorbed residue material (③). When the ①, ②, and ③ procedures are repeated several times, multiple metal oxide films may be formed. Therefore, the metal oxide films may be stably deposited on the boron nitride surface. The metal oxide films deposited on the boron nitride surface may have a thickness of 1 to 50 nm. When the thickness of the metal oxide films satisfies the above-mentioned range, good wettability and dispersability with respect to an epoxy resin, excellent processability, and high thermal conductivity may be achieved.

Meanwhile, the inorganic filler included in the epoxy resin composition according to one embodiment of the present invention may further include aluminum oxide. The aluminum oxide has lower thermal conductivity but has better wettability and dispersability than an epoxy resin and has excellent processability, compared to boron nitride. Here, the boron nitride having the metal oxide film may be included at 10 to 30 parts by weight, and preferably 12 to 20 parts by weight with respect to 10 parts by weight of the aluminum oxide. When the aluminum oxide and the boron nitride are included within the above-mentioned ranges, an epoxy resin composition having excellent adhesive strength, processability, and high thermal conductivity may be achieved. When the boron nitride having the metal oxide films is included at less than 10 parts by weight with respect to 10 parts by weight of the aluminum oxide, low thermal conductivity may be exhibited. In addition, when the boron nitride having the metal oxide films is included at more than 30 parts by weight with respect to 10 parts by weight of the aluminum oxide, low peel strength may be exhibited.

The epoxy resin composition according to one embodiment of the present invention may be applied to a printed circuit board. FIG. 1 is a cross-sectional view of a printed circuit board according to one embodiment of the present invention.

Referring to FIG. 1, a printed circuit board 100 comprises a metal plate 110, an insulating layer 120 and a circuit pattern 130.

The metal plate 110 may consist of copper, aluminum, nickel, gold, platinum, and an alloy thereof.

An insulating layer 120 consisting of the epoxy resin composition according to one embodiment of the present invention is formed on the metal plate 110.

The circuit pattern 130 is formed on the insulating layer 120. The circuit pattern 130 may consist of a metal such as copper or nickel.

The insulating layer 120 may insulate the metal plate 110 from the circuit pattern 130.

Figure 2:
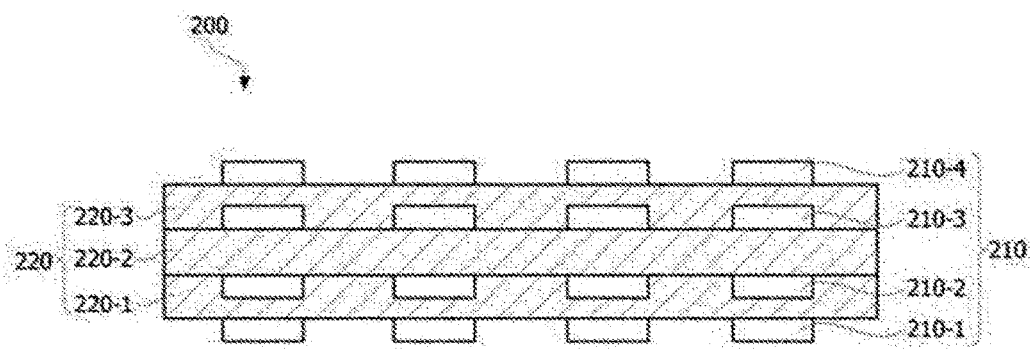
FIG. 2 is a cross-sectional view of a printed circuit board another embodiment of the present invention.

FIG. 2 is a cross-sectional view of a printed circuit board according to another embodiment of the present invention.

Referring to FIG. 2, a multi-layered printed circuit board 200 comprises multiple circuit pattern layers 210 which are sequentially disposed and multiple insulating layers 220 which are formed between the multiple circuit pattern layers 210. That is, the printed circuit board 200 comprises an insulating layer 220-1 having a circuit pattern layer 210-1 on the bottom surface, an insulating layer 220-2 having circuit pattern layers 210-2 and 210-3 on the top and bottom surfaces, and an insulating layer 220-3 having a circuit pattern layer 210-4 on the top surface.

Here, the insulating layers 220 insulates the circuit pattern layers 210. The epoxy resin composition according to one embodiment of the present invention may be applied to at least one of the insulating layers 220-1, 220-2, and 220-3.

In addition, the circuit pattern layers 210 may consist of a metal such as copper or nickel. Although not illustrated in the drawing, the multi-layered printed circuit board 200 may be formed on a metal plate. Here, the metal plate may include copper, aluminum, nickel, gold, platinum, and an alloy thereof.

For convenience of description, a four-layered printed circuit board is illustrated, but the epoxy resin composition according to one embodiment of the present invention may be applied on various boards such as a 10-layered printed circuit board, a 12-layered printed circuit board, etc.

A printed circuit board having excellent heat dissipation may be obtained by curing the epoxy resin composition according to one embodiment of the present invention and using the cured epoxy resin composition as an insulating layer.

Hereinafter, the present invention will be described in further detail with reference to examples and comparative examples.

Example 1

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in methyl ethyl ketone (MEK), and then 50 wt % of aluminum oxide and 40 wt % of boron nitride having a surface aluminum oxide film were added thereto, followed by stirring for 2 hours. After stirring, a copper plate was coated with the resulting solution, pressurized at 80° C. for 30 minutes and at 180° C. for 1.5 hours, and thereby an epoxy resin composition of Example 1 was obtained.

Example 2

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 20 wt % of aluminum oxide and 70 wt % of boron nitride having a surface aluminum oxide film were added thereto, followed by stirring for 2 hours. After stirring, a copper plate was coated with the resulting solution, pressurized at 80° C. for 30 minutes and at 180° C. for 1.5 hours, and thereby an epoxy resin composition of Example 2 was obtained.

Example 3

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 40 wt % of aluminum oxide and 50 wt % of boron nitride having a surface aluminum oxide film were added thereto, followed by stirring for 2 hours. After stirring, a copper plate was coated with the resulting solution, pressurized at 80° C. for 30 minutes and at 180° C. for 1.5 hours, and thereby an epoxy resin composition of Example 3 was obtained.

Example 4

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 30 wt % of aluminum oxide and 60 wt % of boron nitride having a surface aluminum oxide film were added thereto, followed by stirring for 2 hours. After stirring, a copper plate was coated with the resulting solution, pressurized at 80° C. for 30 minutes and at 180° C. for 1.5 hours, and thereby an epoxy resin composition of Example 4 was obtained.

Comparative Example 1

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 50 wt % of aluminum oxide and 40 wt % of boron nitride of which surface was not treated were added thereto, followed by stirring for 2 hours. After stirring, a copper plate was coated with the resulting solution, pressurized at 80° C. for 30 minutes and at 180° C. for 1.5 hours, and thereby an epoxy resin composition of Comparative Example 1 was obtained.

Comparative Example 2

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 20 wt % of aluminum oxide and 70 wt % of boron of which surface was not treated were added thereto, followed by stirring for 2 hours. After stirring, a copper plate was coated with the resulting solution, pressurized at 80° C. for 30 minutes and at 180° C. for 1.5 hours, and thereby an epoxy resin composition of Comparative Example 2 was obtained.

Comparative Example 3

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 40 wt % of aluminum oxide and 50 wt % of boron nitride of which surface was not treated were added thereto, followed by stirring for 2 hours. After stirring, a copper plate was coated with the resulting solution, pressurized at 80° C. for 30 minutes and at 180° C. for 1.5 hours, and thereby an epoxy resin composition of Comparative Example 3 was obtained.

Comparative Example 4

4 wt % of a crystalline epoxy compound (4,4'-biphenol ether diglycidyl ether), 4 wt % of an amorphous epoxy compound of Formula 13, 1.5 wt % of 4,4'-diaminodiphenylsulfone, and 0.5 wt % of a curing accelerator of Formula 15 were dissolved in MEK for 20 minutes, and then 30 wt % of aluminum oxide and 60 wt % of boron nitride of which surface was not treated were added thereto, followed by stirring for 2 hours. After stirring, a copper plate was coated with the resulting solution, pressurized at 80° C. for 30 minutes and at 180° C. for 1.5 hours, and thereby an epoxy resin composition of Comparative Example 4 was obtained.

Experimental Example

Compositions obtained from Examples 1 to 4 and Comparative Examples 1 to 4 were cured, thermal conductivity was measured using LFA447-model instrument manufactured by NETZSCH for analyzing thermal conductivity through an abnormal hot wire method, and a peel strength measurement was performed on an instrument manufactured by YM Tech Co., Ltd. in a vertical direction at a speed of 50 mm/min at 62.5 mm.

Tables 1 to 4 show comparisons of thermal conductivity and peel strength in Examples and Comparative Examples.

TABLE 1

| Experiment No. | Thermal conductivity (W/mK) | Peel strength (kgf/cm) |
|---|---|---|
| Example 1 | 9.54 | 0.91 |
| Comparative Example 1 | 8.1 | 0.35 |

TABLE 2

| Experiment No. | Thermal conductivity (W/mK) | Peel strength (kgf/cm) |
|---|---|---|
| Example 2 | 13.44 | 0.62 |
| Comparative Example 2 | 13.0 | 0.15 |

TABLE 3

| Experiment No. | Thermal conductivity (W/mK) | Peel strength (kgf/cm) |
|---|---|---|
| Example 3 | 12.1 | 1.0 |
| Comparative Example 3 | 10.05 | 0.24 |

TABLE 4

| Experiment No. | Thermal conductivity (W/mK) | Peel strength (kgf/cm) |
|---|---|---|
| Example 4 | 12.3 | 0.85 |
| Comparative Example 4 | 12.17 | 0.2 |

Referring to Table 1, Example 1 including the boron nitride on which the metal oxide film is formed as an inorganic filler shows higher thermal conductivity and peel strength, compared with Comparative Example 1 including boron nitride having no metal oxide film, at the same content. Likewise, referring to Tables 2 to 4, Examples 2 to 4 including boron nitride on which the metal oxide film is formed as an inorganic filler show higher thermal conductivity and peel strength, compared with Comparative Examples 2 to 4 including boron nitride having no metal oxide film, at the same content.

Particularly, Examples 3 and 4 including 10 to 30 parts by weight of boron nitride with respect to 10 parts by weight of aluminum oxide, as an inorganic filler, show a thermal conductivity of 11 W/mK or more, a peel strength of 0.8 kgf/cm or more, indicating that both the thermal conductivity and peel strength are excellent.

Above, the present invention has been described with reference to exemplary examples, but it is understood by those of ordinary skill in the art that the present invention may be changed and modified in various forms without departing from the spirit and scope of the present invention which are described in the accompanying claims.

The invention claimed is:

1. An epoxy resin composition, comprising:
 an epoxy resin;
 a curing agent; and
 an inorganic filler, wherein the inorganic filler includes a boron nitride agglomerate having a metal oxide film formed on a surface,
 wherein the metal oxide film is formed as a multi-layered structure,
 wherein the inorganic filler further includes aluminum oxide, and
 wherein the boron nitride agglomerate on which the metal oxide film is formed is included at 10 to 30 parts by weight in the inorganic filler with respect to 10 parts by weight of the aluminum oxide in the inorganic filler.

2. The composition of claim 1, wherein the metal oxide film includes titanium oxide, aluminum oxide and zirconium oxide.

3. The composition of claim 1, wherein the boron nitride agglomerate on which the metal oxide film is formed is included at 12 to 20 parts by weight in the inorganic filler with respect to 10 parts by weight of the aluminum oxide in the inorganic filler.

4. The composition of claim 1, wherein the epoxy resin includes a crystalline epoxy compound.

5. The composition of claim 4, wherein the crystalline epoxy compound has a mesogen structure.

6. The composition of claim 5, wherein the curing agent includes diaminodiphenylsulfone.

7. The composition of claim 4, wherein the epoxy resin further includes an amorphous epoxy compound.

8. The composition of claim 1, wherein the metal oxide film is deposited on the surface of the boron nitride agglomerate through an atomic layer deposition (ALD) process.

9. A printed circuit board, comprising:
 a metal plate;
 an insulating layer formed on the metal plate; and
 a circuit pattern formed on the insulating layer,
 wherein the insulating layer includes an epoxy resin, a curing agent, and an inorganic filler, the inorganic filler including a boron nitride agglomerate on which a metal oxide film is formed,
 wherein the metal oxide film is formed as a multi-layered structure,
 wherein the inorganic filler further includes aluminum oxide, and
 wherein the boron nitride agglomerate on which the metal oxide film is formed is included at 10 to 30 parts by weight in the inorganic filler with respect to 10 parts by weight of the aluminum oxide in the inorganic filler.

10. The printed circuit board of claim 9, wherein the insulating layer has a thermal conductivity of 11 W/mK or more, and a peel strength of 0.8 kgf/cm or more.

11. A printed circuit board, comprising:
 multiple circuit pattern layers sequentially disposed; and
 multiple insulating layers disposed between the multiple circuit pattern layers,
 wherein at least one of the multiple insulating layers includes an epoxy resin, a curing agent, and an inorganic filler, the inorganic filler including a boron nitride agglomerate on which a metal oxide film is formed,
 wherein the metal oxide film is formed as a multi-layered structure,
 wherein the inorganic filler further includes aluminum oxide, and
 wherein the boron nitride agglomerate on which the metal oxide film is formed is included at 10 to 30 parts by weight in the inorganic filler with respect to 10 parts by weight of the aluminum oxide in the inorganic filler.

12. The printed circuit board of claim 11, wherein the multiple circuit pattern layers have one of 4-, 10- and 12-layered structures.

* * * * *